(12) United States Patent
Yasuda

(10) Patent No.: US 11,122,213 B2
(45) Date of Patent: Sep. 14, 2021

(54) IMAGING APPARATUS

(71) Applicant: CANON KABUSHIKI KAISHA, Tokyo (JP)

(72) Inventor: Takayuki Yasuda, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 86 days.

(21) Appl. No.: 16/752,027

(22) Filed: Jan. 24, 2020

(65) Prior Publication Data

US 2020/0252534 A1 Aug. 6, 2020

(30) Foreign Application Priority Data

Jan. 31, 2019 (JP) .............................. JP2019-016309

(51) Int. Cl.
| | |
|---|---|
| *H04N 5/235* | (2006.01) |
| *H01L 27/146* | (2006.01) |
| *H04N 5/369* | (2011.01) |
| *H04N 5/353* | (2011.01) |

(52) U.S. Cl.
CPC ..... *H04N 5/2353* (2013.01); *H01L 27/14623* (2013.01); *H01L 27/14643* (2013.01); *H04N 5/2351* (2013.01)

(58) Field of Classification Search
CPC ............... H04N 5/2353; H04N 5/2351; H04N 5/36961; H04N 5/3535; H04N 5/3696; H04N 5/232122; H04N 5/23212; H01L 27/14623; H01L 27/14643; H01L 31/107
USPC .................................................. 348/349, 350
See application file for complete search history.

(56) References Cited

U.S. PATENT DOCUMENTS

| | | | | |
|---|---|---|---|---|
| 8,767,091 B2* | 7/2014 | Bell | ....................... | H04N 5/235 348/229.1 |
| 2005/0057666 A1* | 3/2005 | Hu | ....................... | H04N 5/2351 348/229.1 |
| 2011/0249148 A1* | 10/2011 | Prescher | .............. | H04N 9/0451 348/234 |
| 2014/0285706 A1* | 9/2014 | Theuwissen | ....... | H04N 5/36961 348/350 |
| 2019/0191067 A1* | 6/2019 | Vaillant | .................. | H04N 9/045 |

(Continued)

FOREIGN PATENT DOCUMENTS

JP 2017-5443 A 1/2017

*Primary Examiner* — Albert H Cutler
(74) *Attorney, Agent, or Firm* — Canon U.S.A., Inc. IP Division

(57) ABSTRACT

An apparatus includes an imaging device including a plurality of light receiving units each converting a light beam into a voltage pulse based on an avalanche effect, and a controller having a processor which executes instructions stored in a memory, the controller being configured to function as a generation unit configured to generate image data based on the voltage pulse, a detection unit configured to detect a focus state of an imaging optical system based on the voltage pulse, and a control unit configured to control an exposure time of the light receiving units. The control unit includes a histogram generation unit and a determination unit. The histogram generation unit generates a histogram of the plurality of light receiving units based on the voltage pulse, and the determination unit determines an exposure state of the plurality of light receiving units based on the histogram generated by the histogram generation unit.

16 Claims, 9 Drawing Sheets

(56) References Cited

U.S. PATENT DOCUMENTS

2019/0353760 A1\* 11/2019 Hasegawa ............. G01S 7/4863
2020/0137373 A1\* 4/2020 Iguchi ...................... G01C 3/06

\* cited by examiner

FIG.3

|  | 1 | 2 | 3 | 4 | 5 | 6 | 7 | 8 | 9 | 10 | 11 | 12 |
|---|---|---|---|---|---|---|---|---|---|---|---|---|
| LINE 1 | R | G | R | G | R | G | R | G | R | G | R | G |
| LINE 2 | G | Apix | G | B | G | Apix | G | B | G | Apix | G | B |
| LINE 3 | R | G | R | G | R | G | R | G | R | G | R | G |
| LINE 4 | G | B | G | B | G | B | G | B | G | B | G | B |
| LINE 5 | R | G | R | G | R | G | R | G | R | G | R | G |
| LINE 6 | G | B | G | B | G | B | G | B | G | B | G | B |
| LINE 7 | R | G | R | G | R | G | R | G | R | G | R | G |
| LINE 8 | G | B | G | B | G | B | G | B | G | B | G | B |
| LINE 9 | R | G | R | G | R | G | R | G | R | G | R | G |
| LINE 10 | G | B | G | B | G | B | G | B | G | B | G | B |
| LINE 11 | R | G | R | G | R | G | R | G | R | G | R | G |
| LINE 12 | G | Bpix | G | B | G | Bpix | G | B | G | Bpix | G | B |
| LINE 13 | R | G | R | G | R | G | R | G | R | G | R | G |

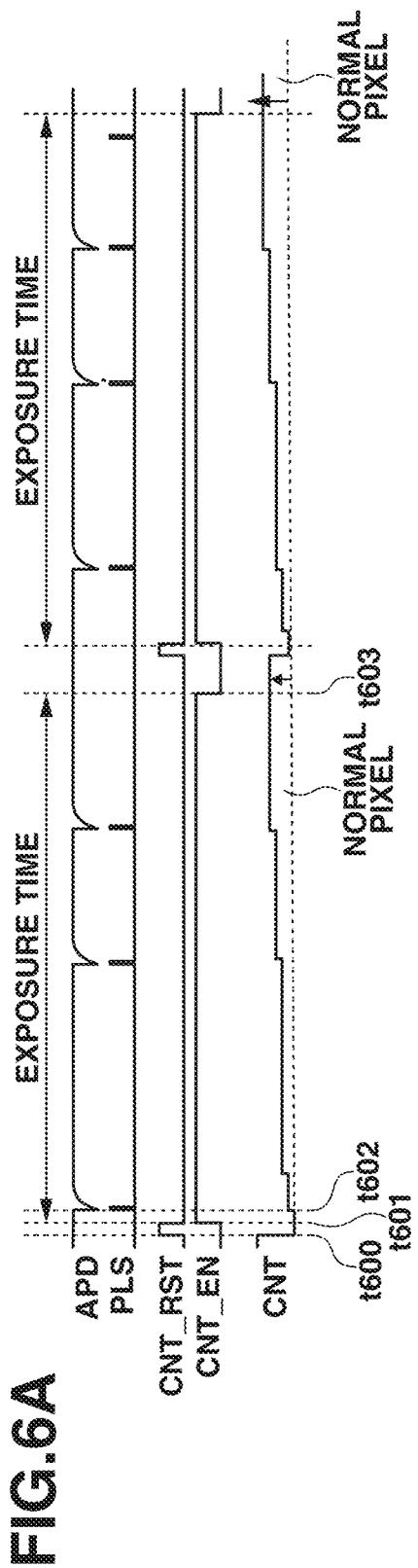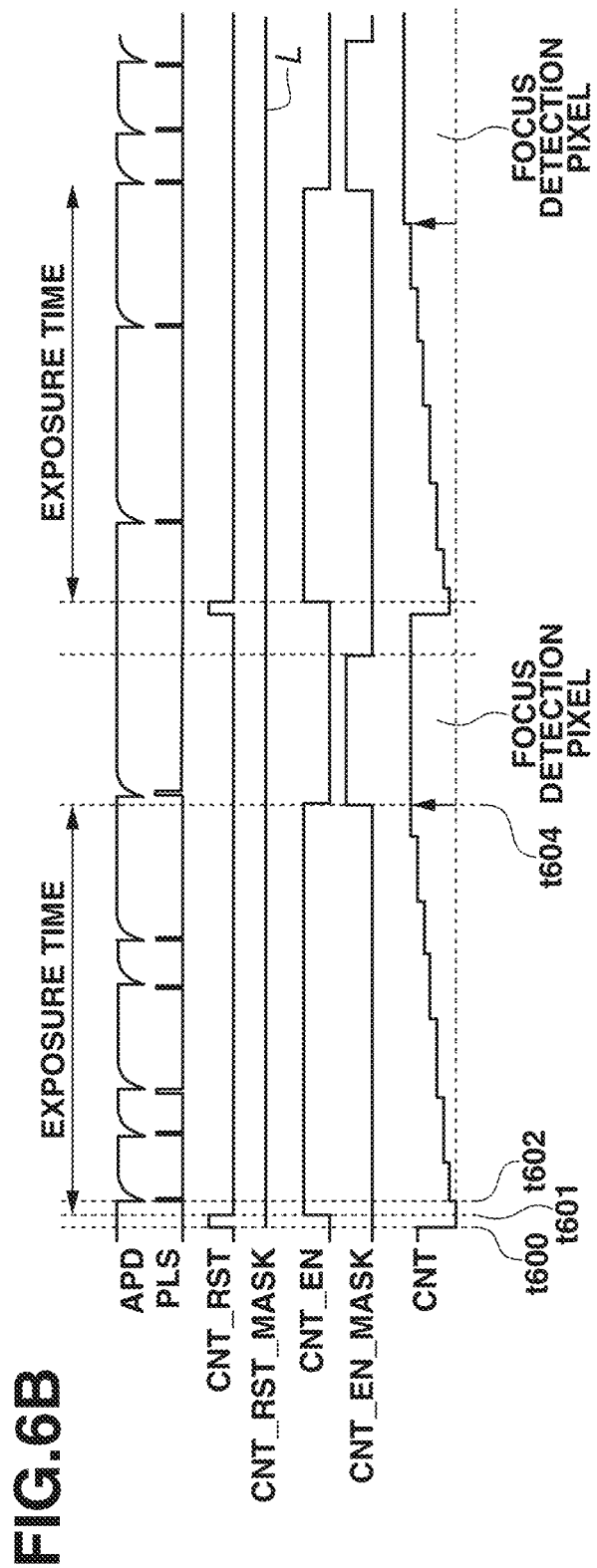

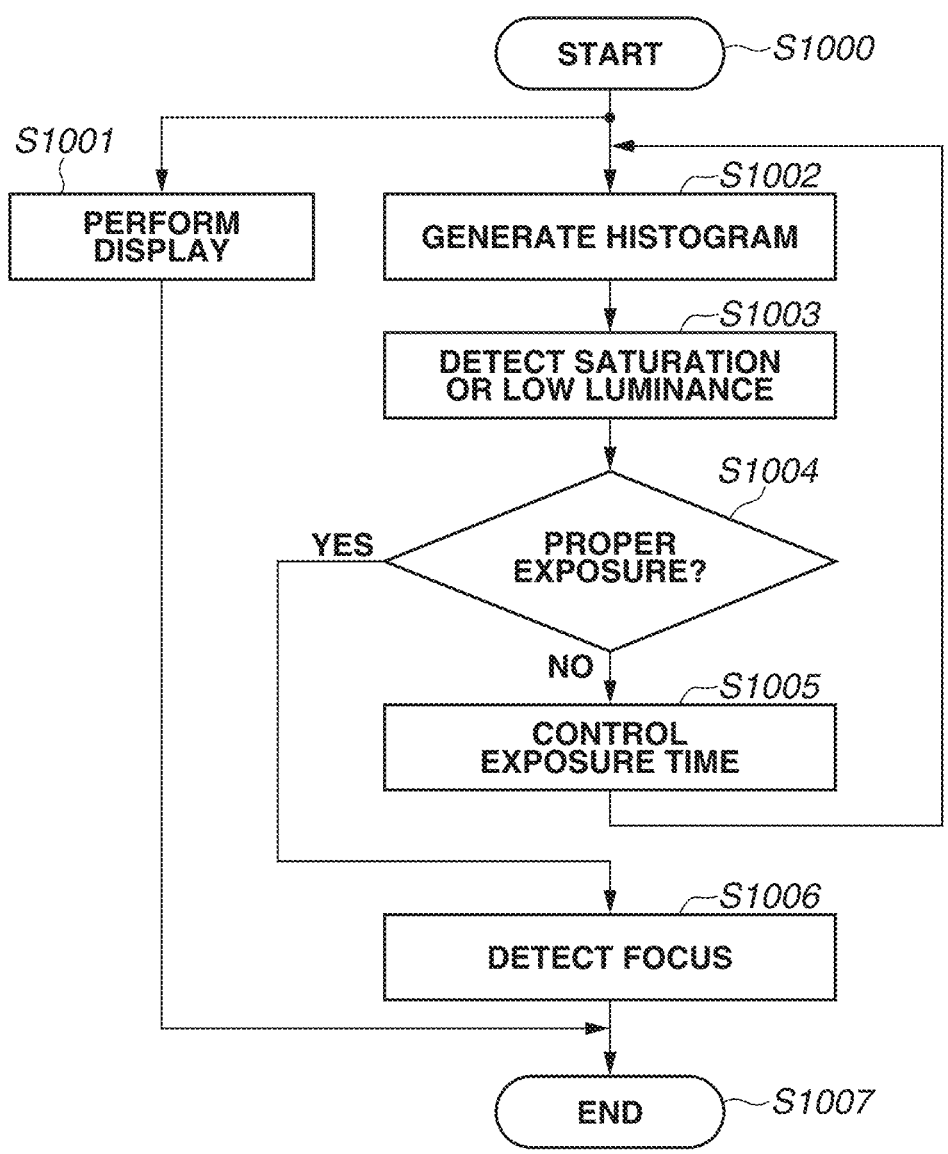

IMAGING APPARATUS

BACKGROUND OF THE INVENTION

Field of the Invention

The aspect of the embodiments relates to an imaging apparatus.

Description of the Related Art

As an imaging device that can acquire an imaging signal based on an object image formed by an imaging lens, an imaging device that includes detection pixels for focus detection of the imaging lens in addition to imaging pixels for acquisition of the imaging signal has been well-known. Further, a technology to independently control the imaging pixels and the detection pixels of such an imaging device has been well-known.

For example, Japanese Patent Application Laid-Open No. 2017-5443 discusses a technology that independently controls the imaging pixels and the detection pixels to read out a signal from the imaging pixels at timing earlier than readout timing of the detection pixels, thereby further accelerating focus detection.

SUMMARY OF THE INVENTION

According to an aspect of the embodiments, an apparatus includes an imaging device including a plurality of first light receiving units and a plurality of second light receiving units arranged in a matrix direction, the first light receiving units each converting a light beam entering from an exit pupil of an imaging optical system into a first voltage pulse based on an avalanche effect, and the second light receiving units each converting a light beam entering from a part of the exit pupil of the imaging optical system into a second voltage pulse based on the avalanche effect, and a controller having a processor which executes instructions stored in a memory, the controller being configured to function as a generation unit configured to generate image data based on the first voltage pulse, a detection unit configured to detect a focus state of the imaging optical system based on the second voltage pulse, and a control unit configured to control an exposure time of the first light receiving units and an exposure time of the second light receiving units. The control unit includes a histogram generation unit and a determination unit, the histogram generation unit generates a histogram of the plurality of second light receiving units based on the second voltage pulse, and the determination unit determines an exposure state of the plurality of second light receiving units based on the histogram generated by the histogram generation unit. The control unit controls the exposure time of the second light receiving units based on a result of the determination by the determination unit.

Further features of the disclosure will become apparent from the following description of exemplary embodiments with reference to the attached drawings.

BRIEF DESCRIPTION OF THE DRAWINGS

FIG. 3 is a diagram illustrating arrangement of imaging pixels and detection pixels according to the exemplary embodiment of the disclosure.

FIGS. 6A to 6C are timing charts illustrating driving according to the exemplary embodiment of the disclosure.

FIG. 8 is a flowchart illustrating operation by the imaging apparatus according to the exemplary embodiment of the disclosure.

DESCRIPTION OF THE EMBODIMENTS

An exemplary embodiment of the disclosure is described in detail below with reference to accompanying drawings.

Figure 1:
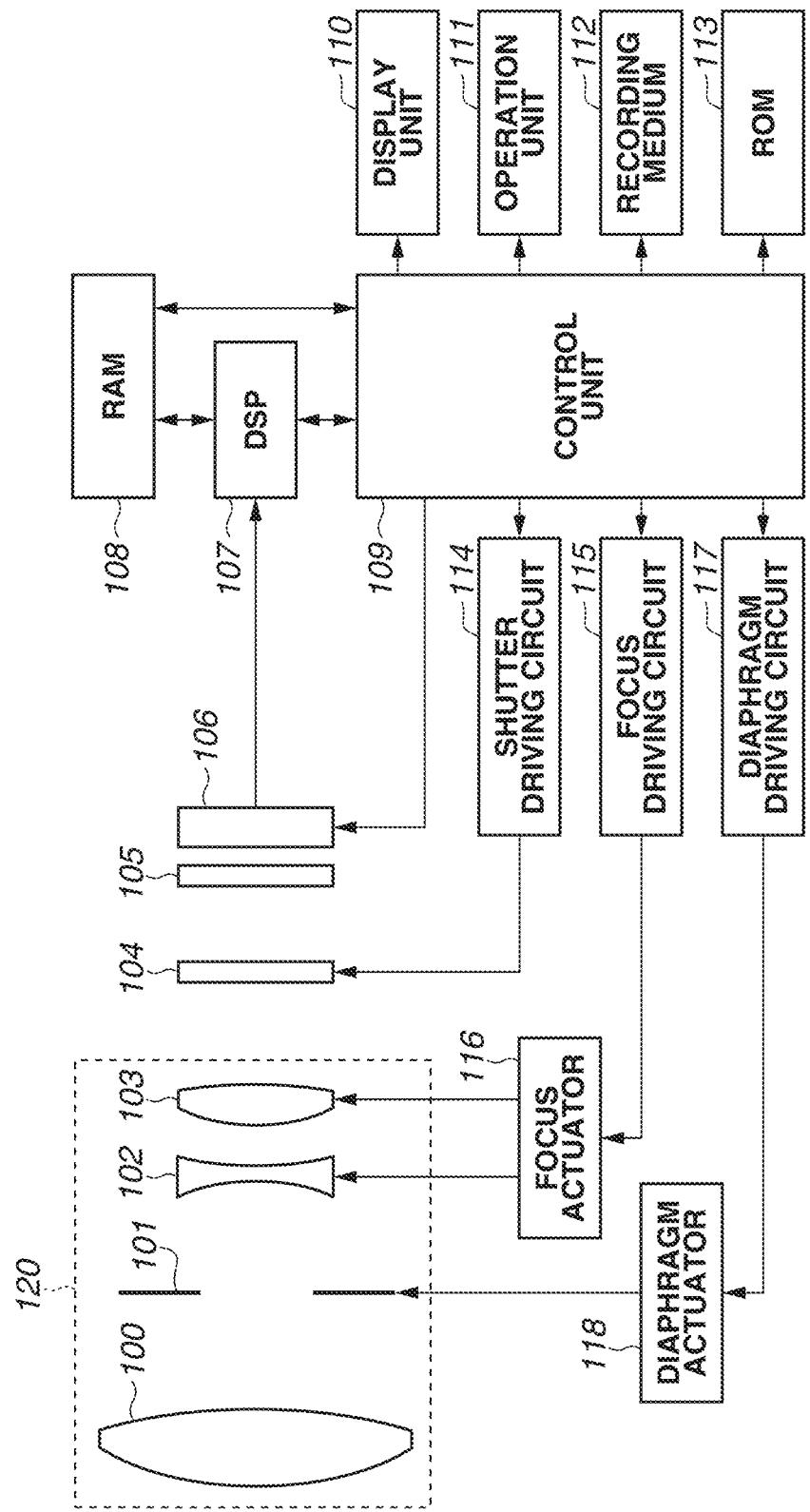
FIG. 1 is a diagram illustrating a configuration of an imaging apparatus according to an exemplary embodiment of the disclosure.

FIG. 1 is a block diagram illustrating a configuration of an imaging apparatus according to the exemplary embodiment of the disclosure. In FIG. 1, a first lens 100 is disposed at a front end of an imaging optical system 120. A diaphragm 101 adjusts an aperture diameter to adjust a light amount in imaging. A second lens 102 and a third lens 103 are driven by a focus actuator 116 described below, and adjust a focus of the imaging optical system 120 by moving forward and backward in an optical axis direction.

A focal plane shutter 104 adjusts an exposure time in imaging of a still image. An optical low-pass filter 105 is used to reduce a false color and moire of a captured image. An imaging device 106 photoelectrically converts an optical image of an object formed by the imaging optical system 120, into an electric signal. The imaging device 106 is controlled by a control unit 109 described below. The imaging device 106 according to the present exemplary embodiment is a so-called photon-counting imaging device that includes pixels using avalanche effect (multiplication). Further, although the detail is described below, the imaging device 106 includes imaging pixels that receive light beams from an entire pupil region of an exit pupil of the imaging optical system 120 and detection pixels that receive light beams from a part of the pupil region. A centroid position of the pupil region of the exit pupil through which the light beams from the object pass is substantially coincident with an optical axis of the imaging optical system 120. In contrast, a centroid position of a part of the pupil region through which the light beams received by the detection pixels pass is eccentric from the optical axis. The centroid position of the part of the pupil region through which the light beams received by the detection pixels pass is eccentric from the centroid position of the exit pupil in a predetermined direction. In the present exemplary embodiment, description is given assuming that the centroid position is eccentric in a row direction; however, the eccentric direction is not limited thereto, and the centroid position may be eccentric in a column direction, or a plurality of eccentric patterns may be included. The imaging device 106 further includes a pixel array in which the pixels are two-dimensionally arranged in the row direction and the column direction, and the pixels are sequentially scanned on a row basis to output image data from the imaging pixels and detection data from the detection pixels.

A digital signal processor (DSP) 107 perform processing such as correction and compression on the image data captured by the imaging device 106. A random access memory (RAM) 108 includes all of a function of a signal holding unit configured to hold the output data from the imaging device 106, a function of a data recording unit configured to record the image data or the detection data processed by the DSP 107, and a function of a work memory for operation of the control unit 109 described below. In the present exemplary embodiment, these functions are achieved by the RAM 108; however, the other type of memory that has sufficiently high access speed and no problem in operation may be used. Further, in the present exemplary embodiment, the RAM 108 is disposed outside the DSP 107 and the control unit 109; however, a part or all of the functions of the RAM 108 may be incorporated in the DSP 107 or the control unit 109, or may be incorporated in the imaging device 106.

The control unit 109 totally controls operation of the imaging apparatus. The control unit 109 includes a central processing unit (CPU), and executes a program to control each unit in the imaging apparatus. Further, the control unit 109 includes a function of controlling a focus driving circuit 115 described below to adjust the focus of the imaging optical system 120 using a result of correlation calculation output from the DSP 107. A display unit 110 displays a captured still image, a captured moving image, a menu, etc. An operation unit 111 performs an imaging instruction and sets an imaging condition, etc. to the control unit 109. A recording medium 112 is a detachable recording medium recording still image data and moving image data. A read-only memory (ROM) 113 stores the program that is loaded and executed by the control unit 109 for control of operation of each unit.

A shutter driving circuit 114 drives and controls the focal plane shutter 104. A focus driving circuit 115 is a focus position changing unit configured to change a focus position of the imaging optical system 120, and adjusts the focus by controlling the focus actuator 116 based on an output of the control unit 109 to move the second lens 102 and the third lens 103 forward and backward in the optical axis direction. A diaphragm driving circuit 117 controls a diaphragm actuator 118 to control an aperture of the diaphragm 101.

Figure 2:
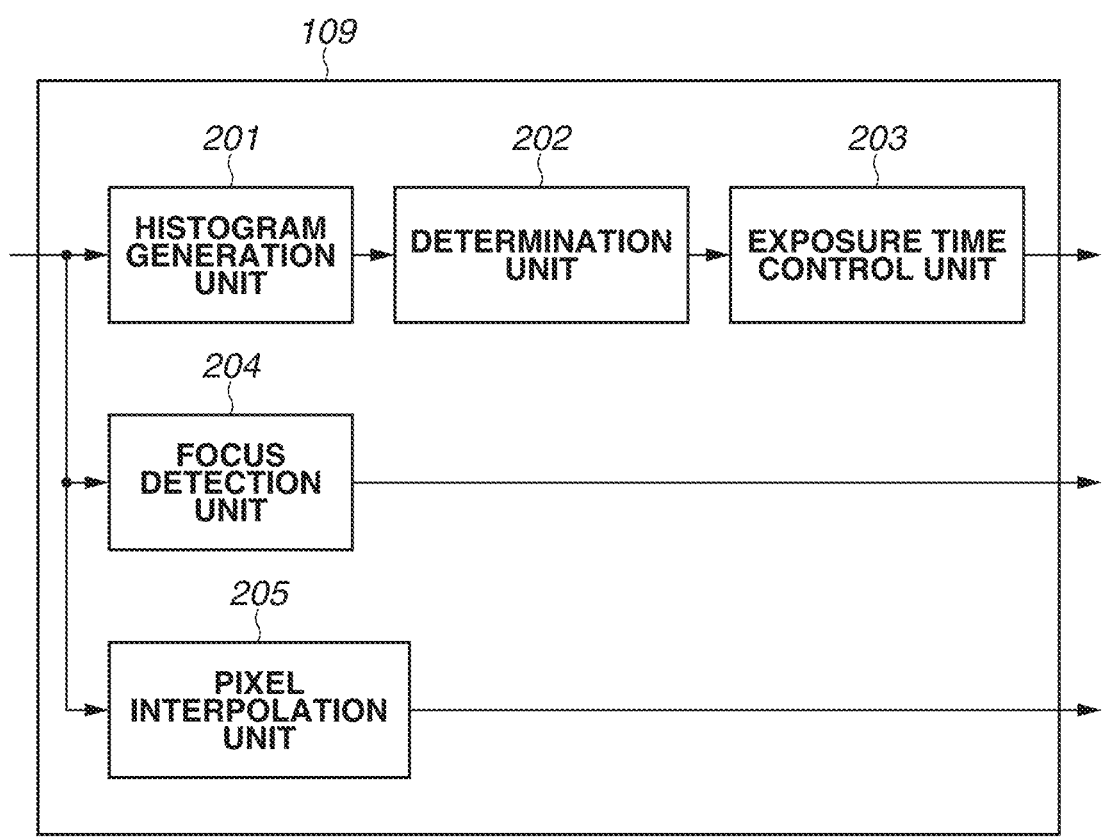
FIG. 2 is a diagram illustrating a configuration of a control unit according to the exemplary embodiment of the disclosure.

FIG. 2 is a diagram illustrating a part of a configuration of the control unit 109 according to the exemplary embodiment of the disclosure. Each block may be a hardware circuit controlled by the CPU included in the control unit 109 or may be realized when the CPU executes a predetermined program. A histogram generation unit 201 generates a histogram of the data obtained from the imaging device 106 or the DSP 107. In particular, in the present exemplary embodiment, the histogram generation unit 201 generates a histogram of the image data or the detection data output from a region including the detection pixels in the pixel array. In the present exemplary embodiment, an example of generating the histogram of a row including the detection pixels (hereinafter, also referred to as detection pixel line) in the pixel array is described. However, generation of the histogram is not limited thereto, and may be changed depending on the layout of the detection pixels in the pixel array, a type of the object, an imaging mode (number of thinned pixels or number of added pixels), etc., or a region including a plurality of rows may be handled as the detection pixel line.

A determination unit 202 determines an exposure state from the histogram of the target detection pixel line obtained from the histogram generation unit 201. For example, the determination unit 202 determines whether the detection pixel line is overexposed (saturated) or underexposed (has low luminance).

An exposure time control unit 203 determines an appropriate exposure time based on the determination result of the exposure state of the target detection pixel line obtained from the determination unit 202, and controls the imaging device 106. The exposure time control unit 203 sets various kinds of parameters of the imaging device 106 or the shutter driving circuit 114 based on the determined exposure time under control of the CPU.

A focus detection unit 204 executes predetermined correlation calculation based on the detection data obtained from the imaging device 106 or the DSP 107. Further, the focus detection unit 204 detects a focus state of the imaging optical system 120 by performing calculation of a defocus amount, etc. on a result of the correlation calculation, based on a triangulation ranging principle. A result of the calculation is converted into a focus lens driving amount, and the focus lens driving amount is output to the focus driving circuit 115.

A pixel interpolation unit 205 extracts the detection data from the data input from the imaging device 106 or the DSP 107, and performs interpolation processing using image data output from the imaging pixels close to the detection pixels from which the detection data is output. Since the detection pixels receive light only from a part of the pupil region of the imaging optical system 120, the data at the detection pixels cannot be used as is as the still image data or the moving image data. Accordingly, in the present exemplary embodiment, the data at the detection pixels is interpolated with the image data to reduce influence of the detection pixels.

In the present exemplary embodiment, the case where the blocks illustrated in FIG. 2 are included in the control unit 109 is described; however, the DSP 107 may include a part or all of the functions of the blocks.

Next, a configuration of the imaging device 106 is described with reference to FIG. 3. A diagram 300 illustrates a part of pixel arrangement configuring a Bayer array in the pixel array of the imaging device 106. A plurality of pixels is arranged in a matrix direction. Pixels 301 illustrated in white in the arrangement are the imaging pixels for acquisition of the image data. Pixels 302 illustrated in gray are the detection pixels to acquire the detection data for focus detection by the focus detection unit 204.

The imaging device 106 according to the present exemplary embodiment includes at least 6000 or more unit pixels in the row direction, and a light receiving surface receiving light from the imaging optical system 120 has an aspect ratio of 16:9 or 3:2. Furthermore, each of the pixels includes a micro lens. The configuration in which each of the pixels includes one photoelectric conversion unit has been described; however, the configuration is not limited thereto, and a configuration in which each of the pixels includes a plurality of photoelectric conversion units (a configuration in which a photoelectric conversion unit is divided into plurality of units) may be adopted to perform the focus detection of the imaging optical system 120.

In the present exemplary embodiment, the plurality of detection pixels is disposed in place of a part of the arranged imaging pixels in discrete lines. For example, the detection pixels are arranged every four pixels at positions of B pixels in a second line and 12-th line. As the detection pixels, a plurality of types of pixels different in light-receiving pupil region is disposed. In the present exemplary embodiment, two types of detection pixels denoted by Apix and Bpix are arranged. The focus can be detected by performing the correlation calculation on a pair of detection data acquired from the two types of detection pixels. The arrangement of the detection pixels is not limited thereto, and the detection pixels may be consecutively arranged in the row direction, or the pixels Apix and Bpix may be adjacently arranged. Further, the detection pixels may be arranged at positions of R pixels or G pixels other than the B pixels. Each of the detection pixels according to the present exemplary embodiment includes a shielding mask that shields entering light beams, between the micro lens and the photoelectric conversion unit. The shielding mask corresponds to a shielding unit, and a region shielded by the shielding mask is made different between the pixels Apix and the pixels Bpix, which limits the pupil region through which the entering light beams pass and allows for acquisition of parallax information.

In the present exemplary embodiment, in the following description, the detection pixel line is described as a data column that is obtained by extracting only detection data output from the detection pixels 302 in the pixel arrangement 300. More specifically, the detection pixel line corresponds to a line only including the detection pixels located at columns 2, 6, and 10 of a line 2, or a line only including the detection pixels located at columns 2, 6, and 10 of a line 12.

Figure 4:
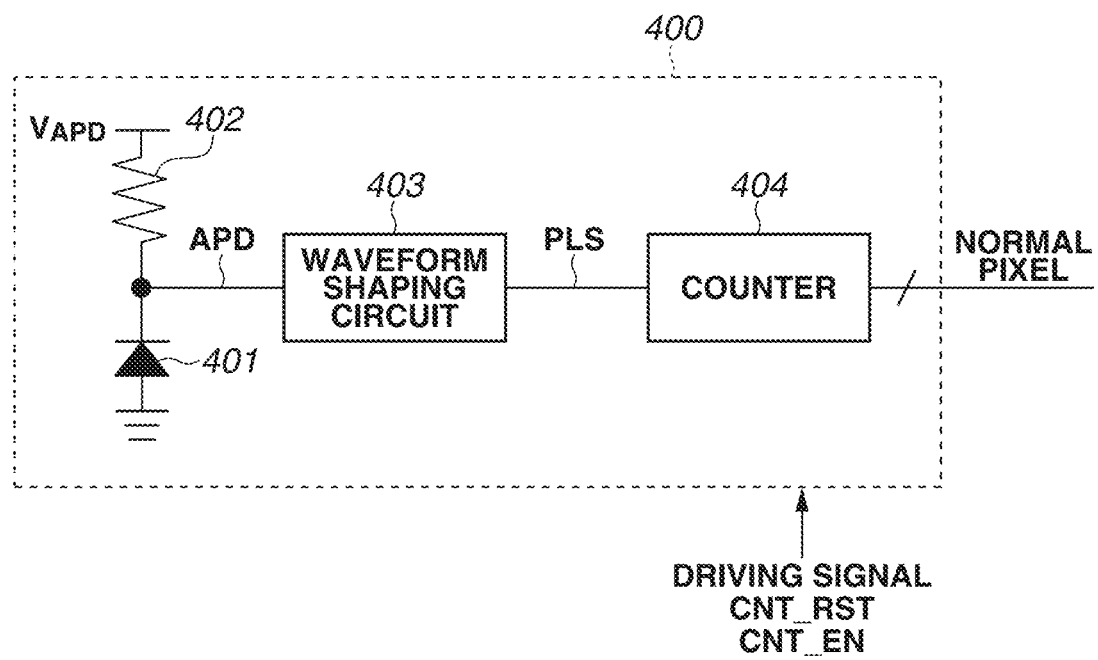
FIG. 4 is a circuit diagram illustrating a configuration of one imaging pixel according to the exemplary embodiment of the disclosure.

Next, a configuration of one imaging pixel 301 is described in detail with reference to FIG. 4. An imaging pixel circuit 400 includes an avalanche photodiode (hereinafter, referred to as APD) 401, a quench resistor 402, a waveform shaping circuit 403, and a counter 404. The APD 401 is supplied with a reverse bias voltage $V_{APD}$ through the quench resistor 402, and generates charges by avalanche multiplication when photons enter the APD 401. The generated charges are discharged through the quench resister 402. In other words, generation of charges by the avalanche multiplication and discharge of the charges through the quench resistor 402 are repeated based on the number of photons entering the APD 401. When a voltage on a cathode side of the APD 401 is regarded as a reference, the voltage is substantially equal to the reverse bias voltage $V_{APD}$ in a case where no photon enters the APD 401, and the voltage is reduced by the charges generated when photons enter the APD 401. The waveform shaping circuit 403 performs amplification and edge detection with respect to the voltage change on the cathode side of the APD 401 caused by generation and discharge of the charges in response to entering of photons, thereby generating a voltage pulse PLS. In the present exemplary embodiment, the APD 401 corresponds to a light receiving unit configured to convert the light beams entering from the exit pupil of the imaging optical system 120, into a voltage pulse based on the avalanche effect.

The counter 404 serving as a counter unit counts the number of voltage pulses PLS output from the waveform shaping circuit 403 for a predetermined time period, and outputs a count result as a digital value to outside of the pixel. Reset and enabling of the counter 404 according to the present exemplary embodiment are respectively controlled by driving signals CNT_RST and CNT_EN described below. These driving signals are supplied from the control unit 109 directly or through a predetermined driver. In the present exemplary embodiment, the counter 404 corresponds to a first count unit that corresponds to the imaging pixel and counts the number of voltage pulses generated within the exposure time.

The digital value as the count result is read out to a memory provided in the imaging device 106 by control from a scanning circuit (not illustrated). The count values are acquired from the imaging pixel circuits 400 in a predetermined region of the pixel array, which can generate an image of one frame.

In the present exemplary embodiment, the waveform shaping circuit 403 and the corresponding counter 404 are provided inside the imaging pixel circuit 400; however, the waveform shaping circuit 403 and the counter 404 may be shared by a plurality of pixels.

Figure 5:
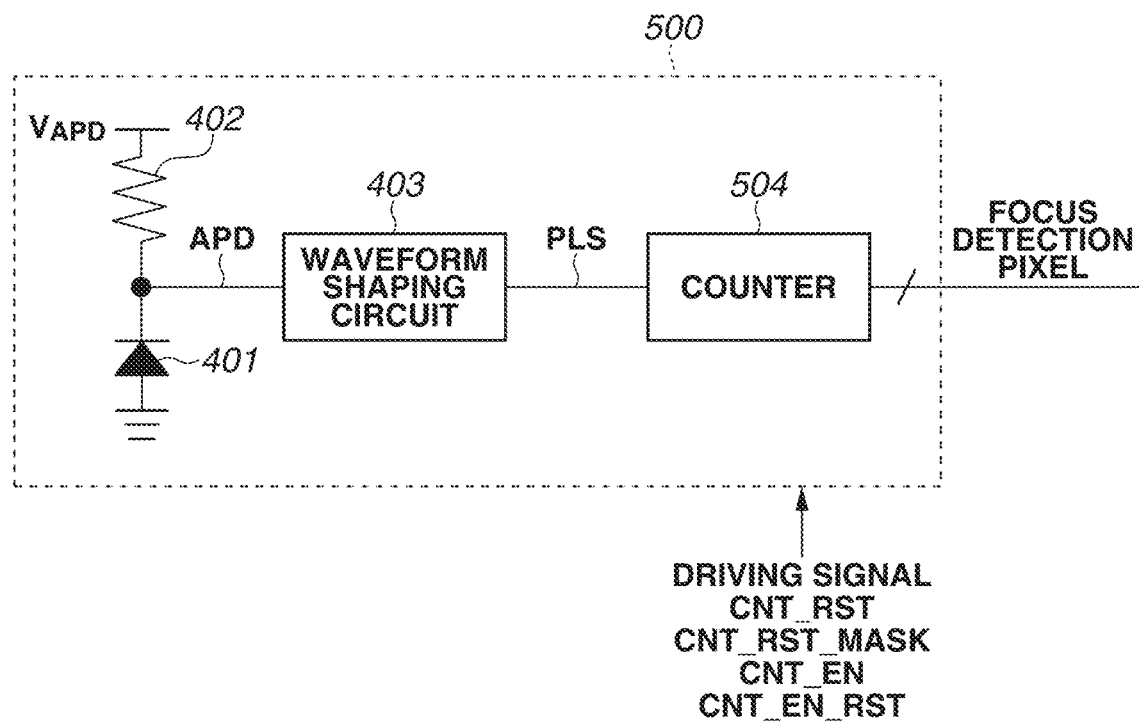
FIG. 5 is a circuit diagram illustrating a configuration of one detection pixel according to the exemplary embodiment of the disclosure.

Next, a configuration of one detection pixel 302 is described with reference to FIG. 5. Components similar to the components in the imaging pixel circuit 400 are denoted by the same reference numerals, and description of such components is omitted. A detection pixel circuit 500 is different from the imaging pixel circuit 400 in that the detection pixel circuit 500 includes a counter 504. More specifically, reset and enabling of the counter 504 according to the present exemplary embodiment are controlled by driving signals CNT_RST, CNT_RST_MSK, CNT_EN, and CNT_EN_MASK described below. These driving signals are supplied from the control unit 109 directly or through a predetermined driver. In the present exemplary embodiment, the counter 504 corresponds to a second count unit that corresponds to the detection pixel and counts the number of voltage pulses generated within the exposure time.

Figure 6C:
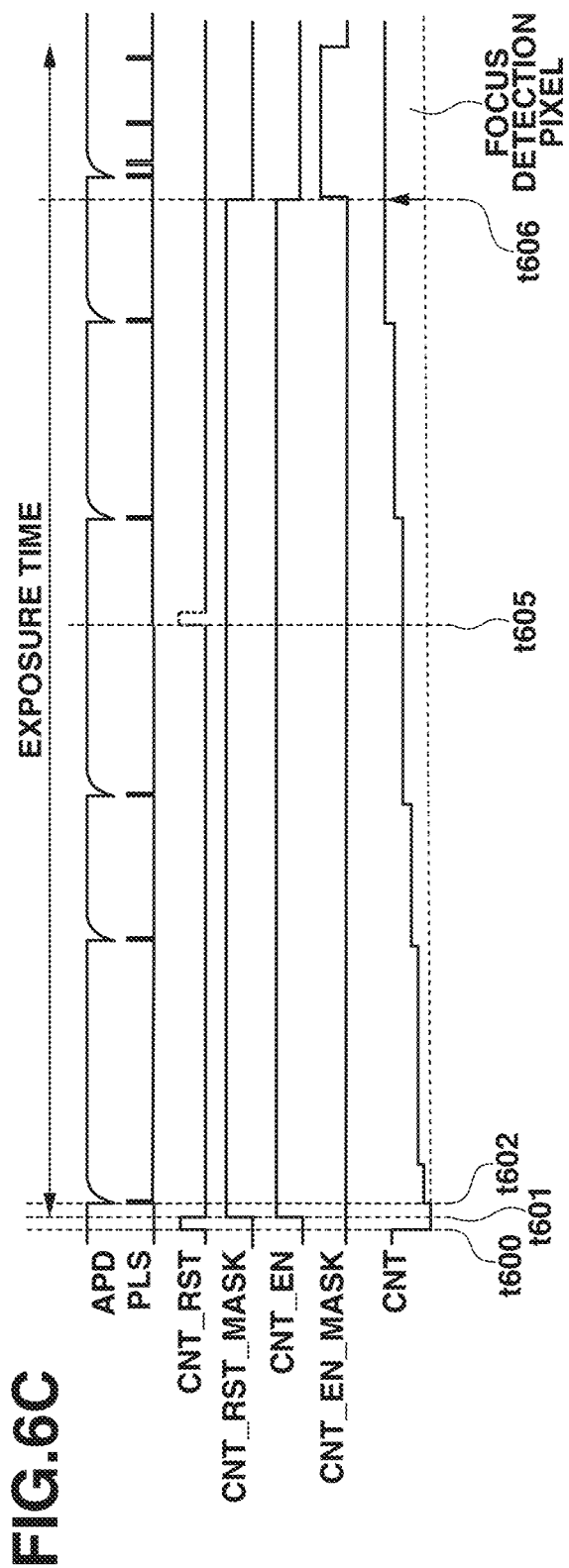

A method of driving the imaging pixels 301 and the detection pixels 302 according to the present exemplary embodiment is described along timing with reference to FIGS. 6A to 6C.

FIG. 6A is a timing chart illustrating driving of one imaging pixel 301. FIG. 6A illustrates imaging driving in one imaging pixel 301. Such imaging driving is performed, for example, in parallel on the plurality of imaging pixels 301 in the same row to convert the optical image into a digital signal. In the present exemplary embodiment, a case of driving the imaging pixel 301 included in the line 2 in FIG. 3 is described. Note that a unit of parallel driving is not limited to the row, and the imaging pixels in a plurality of rows may be driven at the same time, or the imaging pixels in the same column may be driven in parallel. In FIG. 6A, the driving signals CNT_RST and CNT_EN respectively corresponds to a reset control line and an enable control line, and control the counter 404. When the driving signal CNT_RST becomes a High level (hereinafter, referred to as an "H" level), the count value of the counter 404 is reset to zero. The counter 404 counts the number of pulses only during a count period when the driving signal CNT_EN is at the "H" level. A count value CNT of the counter 404 represents the count value by 14 bits from 0 to 16383 in the present exemplary embodiment.

Subsequently, driving of the imaging pixel circuit 400 is described along timing.

At timing t600, the driving signal CNT_RST becomes the "H" level, and the count value of the counter 404 is reset to zero. Thereafter, at timing t601, the driving signal CNT_RST becomes a Low level (hereinafter, referred to as an "L" level), and reset of the counter 404 is completed. At the same time, the driving signal CNT_EN becomes the "H" level, and counting of the voltage pulse by the counter 404 is enabled. As a result, an imaging period that is an exposure time when the voltage pulses in response to photons entering the APD 401 are counted is started. At timing t602, in response to entering of photons to the APD 401, avalanche-multiplied charges are generated, and a potential (APD) on the cathode side of the APD 401 is varied. At this time, since the charges are discharged through the quench resistor 402, the APD requires a predetermined time for reaching a predetermined potential. The waveform shaping circuit 403 detects a falling edge of the APD, and generates a voltage pulse of a short time. The voltage pulse is input to the counter 404, and the count value of the counter 404 is then counted up.

At timing t602 to timing t603, the voltage pulses generated by the waveform shaping circuit 403 in response to entering of photons are counted by the counter 404. At timing t603, the driving signal CNT_EN becomes the "L" level, and the imaging period ends. The count value of the counter 404 at the end of the imaging period is output as image data from the imaging pixel 301 to outside of the imaging pixel circuit 400.

Next, a method of driving the detection pixel circuit 500 according to the present exemplary embodiment is described along timing with reference to FIGS. 6B and 6C.

FIG. 6B is a timing chart illustrating driving when a line including the detection pixels 302 is saturated. FIG. 6B illustrates imaging driving in one detection pixel circuit 500. Such imaging driving is performed in parallel on the plurality of detection pixel circuits 500 to convert the optical image into a digital signal.

In FIG. 6B, the driving signals CNT_RST, CNT_RST_MSK, CNT_EN, and CNT_EN_MSK control the counter 504. When the driving signal CNT_RST becomes the "H" level, the count value of the counter 504 is reset to zero. The counter 504 counts the number of pulses only during a period when the driving signal CNT_EN is at the "H" level. A count value CNT of the counter 504 represents the count value by 14 bits from 0 to 16383 in the present exemplary embodiment. The driving of the detection pixel circuit 500 is described along timing when the line including the detection pixels 302 (e.g., line 2) is saturated. In the present exemplary embodiment, at timing t600 to timing t602, the detection pixel circuit 500 is driven at timing similar to the timing of the imaging pixel circuit 400 illustrated in FIG. 6A.

At timing t602 to timing t604, the voltage pulses generated by the waveform shaping circuit 403 in response to entering of photons are counted by the counter 504. At timing t604, the driving signal CNT_EN becomes the "L" level, and the imaging period ends. The count value of the counter 504 at the end of the imaging period is output as detection data from the detection pixel 302 to outside of the detection pixel circuit 500.

At timing t604, the driving signal CNT_EN_MSK is shifted to the "H" level by control of the exposure time control unit 203 so as to prevent the detection pixel line from being determined as being saturated. As a result, the driving signal CNT_EN is controlled to the "L" level. Further, the counting operation by the counter 504 is stopped, and the imaging period of the line including the detection pixels ends. As described above, the driving signal CNT_EN_MSK that corresponds to an additional control line for the detection pixel circuit 500 is provided in addition to the driving signal CNT_EN that corresponds to the control line common to the imaging pixel circuit 400 and the detection pixel circuit 500, which makes it possible to perform appropriate control by the small number of control lines.

FIG. 6C is a timing chart illustrating driving when the line including the detection pixels 302 is at low luminance FIG. 6C illustrates imaging driving in one detection pixel circuit 500. Such imaging driving is performed in parallel on the plurality of detection pixel circuits 500 to convert the optical image into a digital signal. In the present exemplary embodiment, at timing t600 to timing t602, the detection pixel circuit 500 is driven at timing similar to the timing of the imaging pixel circuit 400 illustrated in FIG. 6A. At this time, at timing t601, the exposure time control unit 203 controls the driving signal CNT_RST_MSK masking the "H" level of the driving signal CNT_RST, to the "H" level.

At timing t602 to timing t605, the voltage pulses generated by the waveform shaping circuit 403 in response to entering of photons are counted by the counter 504. In the driving illustrated in FIG. 6C, at timing t605, the driving signal CNT_RST_MSK is shifted to the "H" level to mask the driving signal CNT_RST by control from the exposure time control unit 203 so as to prevent the detection pixel line from being determined as low luminance Therefore, the counter 504 continues the counting operation. In other words, the detection pixel circuit 500 continues the counting operation even at timing when the imaging pixel circuit 400 stops the counting operation.

At timing t606, the driving signals CNT_EN_MSK and CNT_EN are each shifted to the "L" level by control from the exposure time control unit 203, the counting operation by the counter 504 is stopped, and the imaging period in the detection pixel 302 ends.

As described above, the counter 504 of the detection pixel circuit 500 is controlled independently of the exposure time control by the control of the counter 404 of the imaging pixel circuit 400. In other words, the exposure time control unit 203 increases or decreases the exposure time of the detection pixels 302 to appropriately control the exposure time of the detection pixels 302 without influencing the exposure time of the imaging pixels 301.

Figure 7A:
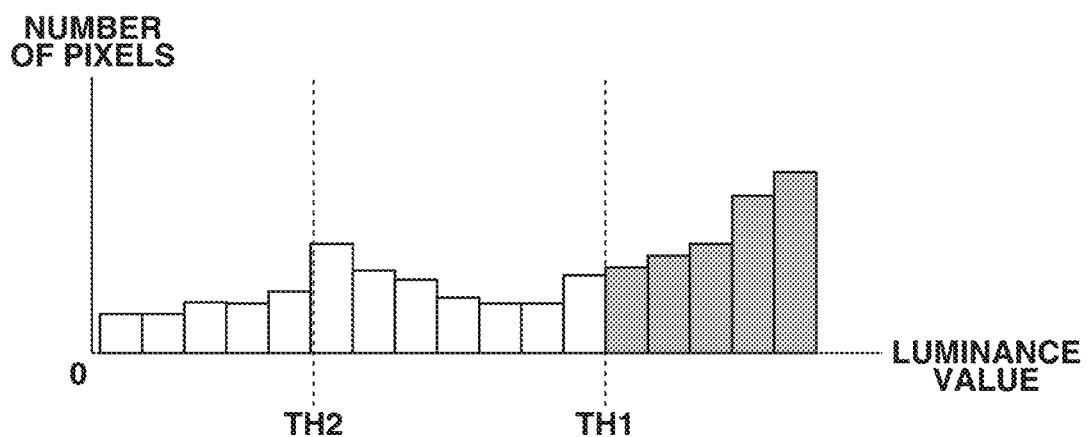
FIGS. 7A and 7B are diagrams each illustrating a histogram of a detection pixel line according to the exemplary embodiment of the disclosure.
Figure 7B:
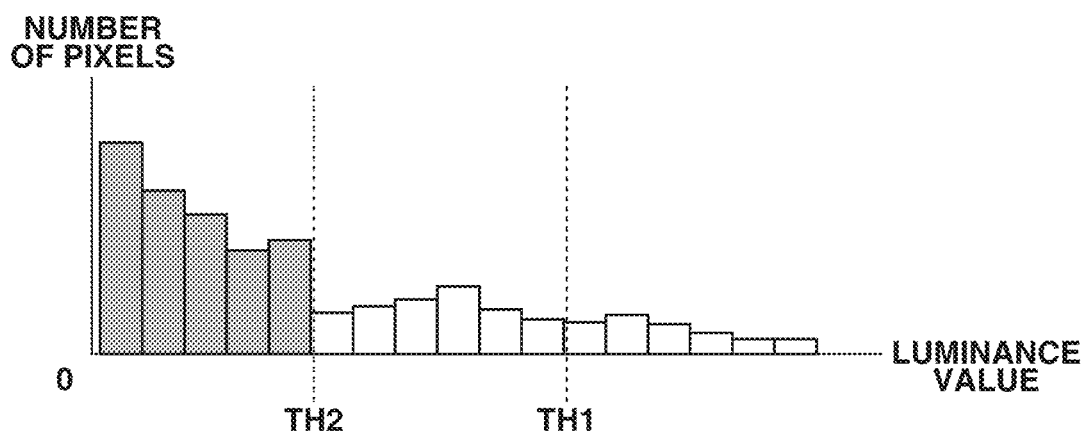

Next, a method of controlling the exposure time of the detection pixel line is described in detail with reference to FIGS. 7A and 7B and Tables 1A and 1B. FIGS. 7A and 7B are diagrams each illustrating a histogram generated by the histogram generation unit 201 from a luminance value of the detection pixel line acquired from the imaging device 106. FIGS. 7A and 7B illustrate that the pixel is a saturated pixel in a region where the luminance value illustrated in a lateral axis is higher than or equal to a threshold TH1, and the pixel is a low-luminance pixel in a region where the luminance value is lower than or equal to a threshold TH2.

For example, in a case where the possible luminance value is represented by 14 bits from 0 to 16383 and the threshold TH1 is set to 14000, the pixels each having the luminance value of 14000 or higher among the detection pixels in the detection pixel line are counted as the saturated pixels. Further, for example, when the threshold TH2 is set to 2000, the pixels each having the luminance value of 2000 or lower among the detection pixels in the detection pixel line are counted as the low-luminance pixels. FIG. 7A is a diagram illustrating saturation of the detection pixel line, and FIG. 7B is a diagram illustrating low luminance of the detection pixel line.

Tables 1A and 1B illustrate comparison with a threshold that is used by the determination unit 202 determining the exposure state, to determine whether the target detection pixel line is saturated or at low luminance from the histogram generated by the histogram generation unit 201.

TABLE 1A

| | Number of pixels | Threshold number |
|---|---|---|
| Number of saturated pixels (luminance value ≥ TH1) | 746 pixels | 250 pixels |
| Number of normal pixels (TH1 > luminance value > TH2) | 56 pixels | — |

TABLE 1A-continued

|  | Number of pixels | Threshold number |
|---|---|---|
| Number of low-luminance pixels (TH2 ≥ luminance value) | 198 pixels | 250 pixels |

TABLE 1B

|  | Number of pixels | Threshold number |
|---|---|---|
| Number of saturated pixels (luminance value ≥ TH1) | 91 pixels | 250 pixels |
| Number of normal pixels (TH1 > luminance value > TH2) | 29 pixels | — |
| Number of low-luminance pixels (TH2 ≥ luminance value) | 880 pixels | 250 pixels |

In Tables 1A and 1B, in a case where the number of pixels each having the luminance value higher than or equal to the threshold TH1 is higher than or equal to a threshold number, the determination unit 202 determines that the detection pixel line is saturated. Further, in a case where the number of pixels each having the luminance value lower than or equal to the threshold TH2 is higher than or equal to a threshold number, the determination unit 202 determines that the detection pixel line is at low luminance. In addition, the determination unit 202 outputs the determination result to the exposure time control unit 203.

In the present exemplary embodiment, it is assumed as an example that, in a case where one detection pixel line includes 1000 pixels, the number of saturated pixels (the number of pixels each having a luminance value higher than or equal to the threshold TH1) is 746, and the threshold number is set to 250 or more in Table 1A. In this case, the determination unit 202 determines that the detection pixel line is saturated. In another example, the number of low-luminance pixels (the number of pixels each having a luminance value lower than or equal to the threshold TH2) is 880, and the threshold number is set to 250 or more in Table 1B. The determination unit 202 determines that the detection pixel line is at low luminance.

The threshold with respect to the luminance value and the threshold number with respect to the number of pixels are previously determined and held as parameters. However, each of the threshold with respect to the luminance value and the threshold number with respect to the number of pixels may include a plurality of patterns and may be changed depending on a predetermined condition. The predetermined condition includes an imaging condition, and examples of the imaging condition include International Organization for Standardization (ISO) sensitivity and the exposure time as an exposure condition, the imaging mode set by a user or the like, and temperature of the imaging device 106.

The exposure time control unit 203 outputs the driving signals CNT_RST_MSK and CNT_EN_MSK to the detection pixel circuit 500 through the mask control line based on the determination result of the line including the detection pixel from the determination unit 202, thereby controlling the counter 504. As a result, it is possible to appropriately control the exposure time of the detection pixels 302 without influencing the exposure time of the imaging pixels.

An operation sequence that can appropriately control the exposure time of the detection pixels in the imaging apparatus according to the exemplary embodiment of the disclosure is described below with reference to a flowchart of FIG. 8. Each processing is executed by the control unit 109.

First, in step S1000, the control unit 109 starts processing when the imaging apparatus is turned on by user operation. The processing proceeds to step S1001 and step S1002.

In step S1001, the control unit 109 receives an imaging instruction through operation of the operation unit 111, etc. by the user. The object image formed on the imaging device 106 through the imaging optical system 120 is photoelectrically converted based on the received imaging instruction. The photoelectrically-converted object image is read out as the image data from the imaging pixels 301 in order to generate a display image. In generation of the display image, data at the detection pixels 302 read out at the same time as the image data is corrected by the pixel interpolation unit 205. This operation is performed in parallel with a detection/imaging sequence in step S1002 to step S1006 described below.

In step S1002, the control unit 109 targets the detection pixel line including the columns 2, 6, and 10 of the line 2 in FIG. 3 and the detection pixel line including the columns 2, 6, and 10 of the line 12 in FIG. 3. Further, the control unit 109 causes the histogram generation unit 201 to generate the histogram. The processing then proceeds to step S1003.

In step S1003, the control unit 109 controls the determination unit 202 to determine whether the detection pixel line is saturated or at low luminance in the histogram generated in step S1002. The processing then proceeds to step S1004.

In step S1004, the control unit 109 determines whether the exposure time (exposure amount) in the detection pixel line is proper, based on the determination result in step S1003. In a case where the detection pixel line is saturated or at the low luminance and the determination result is not proper exposure (NO in step S1004), the processing proceeds to step S1005. In a case where the determination result is proper exposure (YES in step S1004), the processing proceeds to step S1006.

In step S1005, in the case where the determination result of the exposure time of the detection pixel line is not proper in step S1004, the control unit 109 changes the exposure time of the detection pixel line. More specifically, in the case where it is determined that the detection pixel line is saturated as illustrated in FIG. 7A, the driving signal CNT_EN_MSK is controlled to shorten the exposure time as illustrated in FIG. 6B. In contrast, in the case where it is determined that the detection pixel line is at low luminance as illustrated in FIG. 7B, the driving signal CNT_RST_MSK is controlled to lengthen the exposure time as illustrated in FIG. 6C. The processing then returns to step S1002.

In step S1006, in the case where the determination result of the exposure time of the target detection pixel line is proper in step S1004, the control unit 109 causes the focus detection unit 204 to perform focus detection based on the target detection pixel line output from the imaging device 106. A result of the focus detection is output to the focus driving circuit 115, etc., and the focus of the imaging optical system 120 is adjusted. The processing then proceeds to step S1007.

In step S1007, the control unit 109 repeatedly performs the above-described operation until the control unit 109 receives a power-off instruction, etc. from the user. When the power-off instruction is received from the user, the operation in the flowchart ends.

As described above, independently of control of the exposure time through control of the counter 404 of the imaging pixel circuit 400, the exposure time through control of the counter 504 of the detection pixel circuit 500 can be shortened or lengthened by the control from the exposure time control unit 203. As a result, it is possible to secure an aperture of each of the pixels, and to appropriately control the exposure time of the detection pixels without influencing the exposure time of the imaging pixels.

Other Embodiments

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-016309, filed Jan. 31, 2019, which is hereby incorporated by reference herein in its entirety.

What is claimed is:

1. An apparatus, comprising:
an imaging device including a plurality of first light receiving units and a plurality of second light receiving units arranged in a matrix direction, the first light receiving units each converting a light beam entering from an exit pupil of an imaging optical system into a first voltage pulse based on an avalanche effect, and the second light receiving units each converting a light beam entering from a part of the exit pupil of the imaging optical system into a second voltage pulse based on the avalanche effect; and
a controller having a processor which executes instructions stored in a memory, the controller being configured to function as
a generation unit configured to generate image data based on the first voltage pulse;
a detection unit configured to detect a focus state of the imaging optical system based on the second voltage pulse; and
a control unit configured to control an exposure time of the first light receiving units and an exposure time of the second light receiving units, wherein the control unit includes a histogram generation unit and a determination unit, the histogram generation unit generating a histogram of the plurality of second light receiving units based on the second voltage pulse, and the determination unit determining an exposure state of the plurality of second light receiving units based on the histogram generated by the histogram generation unit, and
wherein the control unit controls the exposure time of the second light receiving units based on a result of the determination by the determination unit.

2. The apparatus according to claim 1,
wherein the imaging device includes first count units corresponding to the respective first light receiving units and second count units corresponding to the respective second light receiving units,
wherein the first count units count a number of first voltage pulses generated within the exposure time,
wherein the second count units count a number of second voltage pulses generated within the exposure time, and
wherein the histogram generation unit generates the histogram based on the number of second voltage pulses generated within the exposure time, counted by the second count units.

3. The apparatus according to claim 1, wherein a centroid position of the part of the exit pupil through which the light beams to be received by the second light receiving units pass is eccentric in a predetermined direction from a centroid position of the exit pupil through which the light beams to be received by the first light receiving units pass.

4. The apparatus according to claim 3, wherein the imaging device further includes shielding units configured to shield the light beams entering the respective second light receiving units.

5. The apparatus according to claim 3, wherein each of the second light receiving units is divided into a plurality of units.

6. The apparatus according to claim 1, wherein the plurality of second light receiving units is arranged in a same row.

7. The apparatus according to claim 1, wherein, in a case where the exposure state of the plurality of second light receiving units is a saturated state, the control unit controls the exposure time of the plurality of second light receiving units to be shorter than the exposure time of the adjacent first light receiving units, and in a case where the exposure state of the plurality of second light receiving units is a low-luminance state, the control unit controls the exposure time of the plurality of second light receiving units to be longer than the exposure time of the adjacent first light receiving units.

8. The apparatus according to claim 7, wherein the control unit controls the exposure time of the first light receiving units without using the determination result of the determination unit.

9. The apparatus according to claim 1,
wherein the determination unit determines the exposure state of the plurality of second light receiving units by comparing a predetermined threshold with the generated histogram, and
wherein the determination unit switches the predetermined threshold based on an imaging condition.

10. The apparatus according to claim 1, wherein the control unit generates image data corresponding to the second light receiving units, based on the first voltage pulse.

11. An apparatus, comprising:
an imaging device including a plurality of first count units and a plurality of second count units arranged in a matrix direction, the first count units each counting a number of first pulses generated by an avalanche effect based on a light beam entering from an exit pupil of an imaging optical system, and the second count units each counting a number of second voltage pulses generated by the avalanche effect based on a light beam entering from a part of the exit pupil of the imaging optical system; and
a controller having a processor which executes instructions stored in a memory or having circuitry, the controller being configured to function as
a generation unit configured to generate image data based on count values of the respective first count units;
a detection unit configured to detect a focus state of the imaging optical system based on count values of the respective second count units; and
a control unit configured to control a count period of the first count units and a count period of the second count units,
wherein the control unit includes a histogram generation unit and a determination unit, the histogram generation unit generating a histogram of the count values of the plurality of second count units, and the determination unit determining an exposure state of a plurality of light receiving units corresponding to the plurality of second count units based on the generated histogram, and
wherein the control unit controls the count period of the second count units based on a result of the determination by the determination unit.

12. The apparatus according to claim 11, wherein the control unit includes a reset control line, an enable control line, and a mask control line, the reset control line resetting the count values of the first count units and the second count units, the enable control line enabling counting operation of the first count units and the second count units, and the mask control line masking control to the second count units based on the reset control line or the enable control line.

13. The apparatus according to claim 11, wherein the imaging device further includes shielding units configured to shield the light beams entering the respective light receiving units.

14. The apparatus according to claim 11, wherein each of the light receiving units is divided into a plurality of units.

15. The apparatus according to claim 11, wherein the plurality of light receiving units is arranged in a same row.

16. The apparatus according to claim 11,
wherein the determination unit determines the exposure state of the plurality of light receiving units by comparing a predetermined threshold with the generated histogram, and
wherein the determination unit switches the predetermined threshold based on an imaging condition.

* * * * *